(12) United States Patent
Yang et al.

(10) Patent No.: US 10,175,274 B2
(45) Date of Patent: Jan. 8, 2019

(54) DEVICE FOR DETECTING OUTPUT CURRENT OF INVERTER

(71) Applicant: LSIS CO., LTD., Anyang-si, Gyeonggi-do (KR)

(72) Inventors: Chun-Suk Yang, Anyang-si (KR); Chengde Xu, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/865,954

(22) Filed: Jan. 9, 2018

(65) Prior Publication Data

US 2018/0275175 A1   Sep. 27, 2018

(30) Foreign Application Priority Data

Mar. 21, 2017   (KR) .................. 10-2017-0035041

(51) Int. Cl.
| | | |
|---|---|---|
| *G01R 19/30* | (2006.01) | |
| *H02M 7/5387* | (2007.01) | |
| *H02M 7/529* | (2006.01) | |
| *H04L 27/20* | (2006.01) | |
| *H02M 1/00* | (2006.01) | |

(52) U.S. Cl.
CPC ............ *G01R 19/30* (2013.01); *H02M 7/529* (2013.01); *H02M 7/53875* (2013.01); *H04L 27/2003* (2013.01); *H02M 2001/0009* (2013.01); *H02M 2007/53876* (2013.01)

(58) Field of Classification Search
CPC .... G01R 19/30; H02M 7/529; H02M 7/5387; H04L 27/2003
USPC ............................. 338/49; 363/132; 180/443
See application file for complete search history.

(56) References Cited

U.S. PATENT DOCUMENTS

| | | | |
|---|---|---|---|
| 2004/0195995 A1 | 10/2004 | Quirion et al. | |
| 2015/0075898 A1* | 3/2015 | Suzuki | ................ B62D 5/0472 180/443 |

FOREIGN PATENT DOCUMENTS

| | | |
|---|---|---|
| EP | 1863160 A2 | 12/2007 |
| EP | 3062428 A2 | 8/2018 |
| JP | 3951516 B2 | 8/2007 |
| JP | 5325561 B2 | 10/2013 |
| JP | 2015061381 A | 3/2015 |
| JP | 5839011 B2 | 1/2016 |
| JP | 6000360 B2 | 9/2016 |
| JP | 2017050973 A | 3/2017 |
| KR | 20040038892 A | 5/2004 |
| KR | 20080060847 A | 7/2008 |

(Continued)

OTHER PUBLICATIONS

European Search Report for related European Application No. 18150437.4; report dated May 28, 2018 (6 pages).

(Continued)

*Primary Examiner* — Kyung S Lee
*Assistant Examiner* — Iman Malakooti
(74) *Attorney, Agent, or Firm* — K&L Gates LLP

(57) ABSTRACT

Disclosed is a device for detecting an output current of an inverter. The device for detecting an output current of an inverter according to the present disclosure includes a shunt resistor connected to an output end of a capacitor of a direct current (DC) link; a detector connected to the shunt resistor and configured to detect the output current; and a controller configured to control a sampling timing of a current in the detector.

4 Claims, 7 Drawing Sheets

(56) References Cited

FOREIGN PATENT DOCUMENTS

| KR | 101261793 | * | 5/2013 | ............. G01R 19/00 |
| KR | 101261793 | B1 | 5/2013 | |

OTHER PUBLICATIONS

Korean Office Action for related Korean Application No. 10-2017-0035041; action dated May 14, 2018; (5 pages).
Japanese Office Action for related Japanese Application No. 2018-003553; action dated Sep. 18, 2018; (4 pages).

* cited by examiner

DEVICE FOR DETECTING OUTPUT CURRENT OF INVERTER

CROSS-REFERENCE TO RELATED APPLICATIONS

Pursuant to 35 U.S.C. § 119(a), this application claims the benefit of earlier filing date and right of priority to Korean Patent Application No. 10-2017-0035041 filed on Mar. 21, 2017, in the Korean Intellectual Property Office, the disclosure of which is hereby incorporated by reference in its entirety.

BACKGROUND

1. Technical Field

The present disclosure relates to a device for detecting an output current of an inverter.

2. Description of the Related Art

An inverter is a typical power conversion device configured to receive and convert an alternating current (AC) power into a direct current (DC) power, and then convert again the converted DC power into AC power to control a power system.

The inverter is used in various forms, such as a fan, a pump, an elevator, a conveying device, a production line, and the like, across the industry.

The inverter includes a rectifier configured to rectify AC power, a capacitor of a DC-link, which is disposed between the rectifier and an inverter part and is configured to smooth the rectified AC power, and the inverter part.

A high potential side DCP and a low potential side DCN are provided at an output stage that is connected from the DC-link to the inverter part. A shunt resistor is connected to the low potential side DCN to detect an output current.

In detection by the shunt resistor, it is important to select a sampling timing. Since there are a dead time, a turn on time, a voltage signal stabilization time, and the like when a power switch is turned on or off due to a hardware structure of the inverter, sampling a current at such times may cause an increase of a measurement error. Therefore, the sampling of the current is performed not at a starting point of an effective vector but at a timing that is delayed by a predetermined time from the starting point thereof.

However, even though the sampling of the current is performed after being delayed by the predetermined time from the starting point of the effective vector, a current detection error may occur due to a hardware delay factor.

SUMMARY

Therefore, it is an object of the present disclosure to provide a device for detecting an output current of an inverter, which is capable of preventing a current detection error even when a circuit delay factor occurs.

To resolve the above-described objective, a device for detecting an output current of an inverter according to one embodiment of the present disclosure includes a shunt resistor connected to an output end of a capacitor of a direct current (DC) link; a detector connected to the shunt resistor and configured to detect the output current; and a controller configured to control a sampling timing of a current in the detector, wherein the controller may compare a length of an effective vector regarding a switching voltage with a predetermined value and modulate the length of the effective vector.

In one embodiment of the present disclosure, the shunt resistor may be connected to a low potential side.

In one embodiment of the present disclosure, the controller may sample the current at a timing that is delayed by a set time based on a median of the effective vector.

In one embodiment of the present disclosure, the controller may modulate the length of the effective vector with a value that is greater than a time at which a current by the effective vector is stabilized.

In one embodiment of the present disclosure, the controller may determine the delayed timing as a value that is greater than a half of the time at which the current by the effective vector is stabilized.

In accordance with the present disclosure, there is an effect capable of minimizing possibility of a current detection error to accurately detect an output current provided to an inverter part.

DETAILED DESCRIPTION

Figure 1:
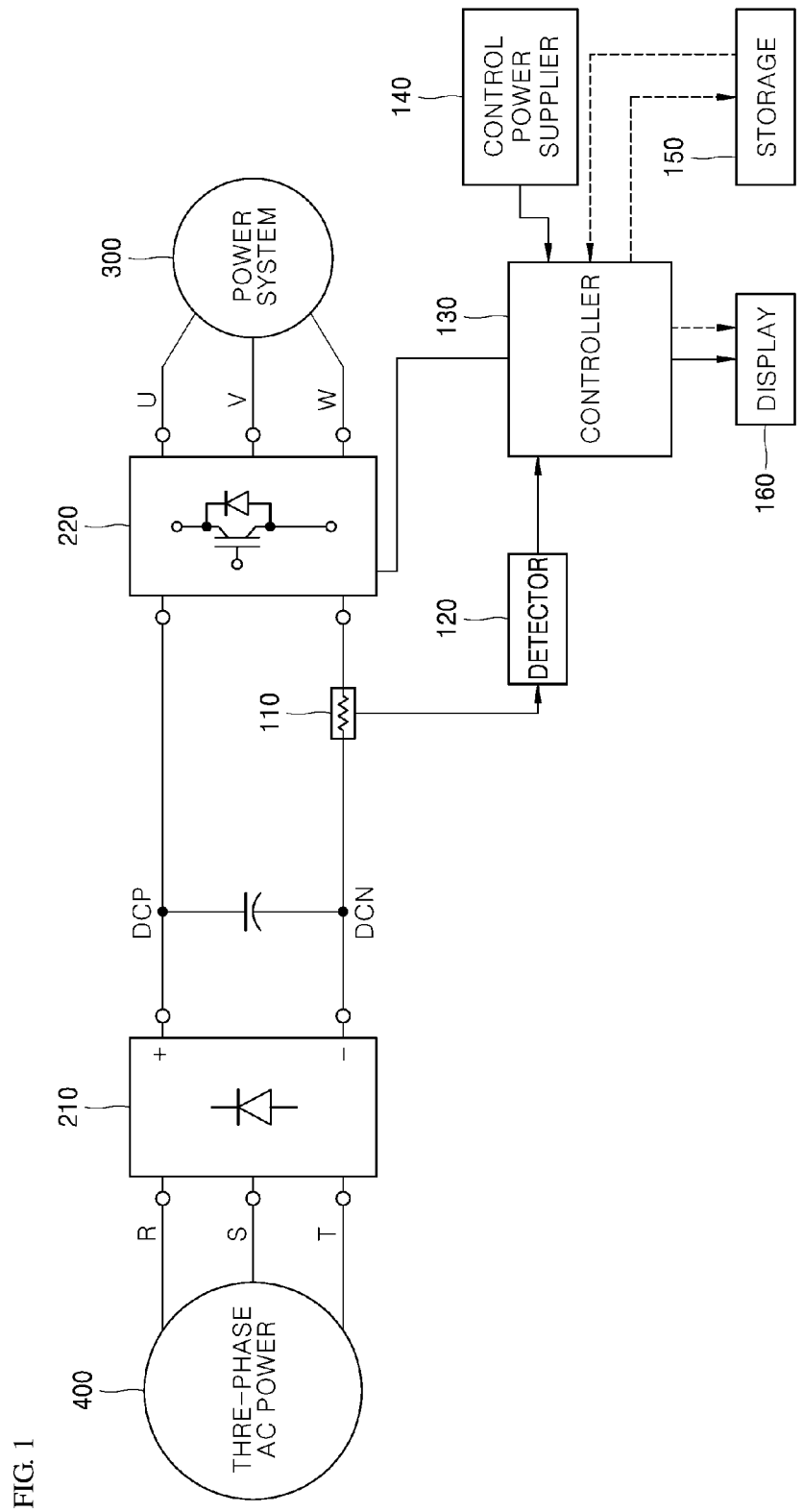
FIG. 1 is a diagram illustrating a device for detecting an output current of an inverter according to one embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, one preferred embodiment according to the present disclosure will be described in detail with reference to the accompanying drawings.

FIG. 1 is a diagram illustrating a device for detecting an output current of an inverter according to one embodiment of the present disclosure.

Referring to FIG. 1, a rectifier 210 may rectify a three-phase alternating current (AC) power 400 (an R-phase, an S-phase, and a T-phase). The rectified power may be smoothed by a capacitor at a direct current (DC)-link configured to connect a high potential side DCP and a low potential side DCN.

The smoothed DC power may be provided to an inverter part 220, and the inverter part 220 may convert again the DC power into three-phase AC power to provide the three-phase AC power to a power system 300.

The present disclosure relates to a device for detecting an output current provided to the inverter part 220 in the above-described inverter.

The device for detecting an output current of an inverter may include a shunt resistor 110, a detector 120, a controller 130, a control power supplier 140, a storage 150, and a display 160.

The shunt resistor 110 may be connected between the low potential side DCN of the DC-link, at which the capacitor is disposed, and the inverter part 220.

The shunt resistor 110 is a resistor having very low resistance and is used for a current measurement.

The detector 120 is connected to the shunt resistor 110 and the controller 130.

The detector 120 may detect a current using a signal across both ends of the shunt resistor 110. The detector 120 may detect the current through sampling thereof and provide the detected current to the controller 130.

The controller 130 may be connected to the detector 120, the display 160, the control power supplier 140, the storage 150, and the inverter part 220.

The controller 130 may receive the detected current from the detector 120 using power supplied from the control power supplier 140, and may control the storage 150, the display 160, and the inverter part 220.

The controller 130 may control a sampling timing of a current in the detector 120. Also, the controller 130 may compare a length of an effective vector regarding a switching voltage with a preset value to modulate the length of the effective vector.

The control power supplier 140 may be connected to the controller 130 and may supply the controller 130 with power required for control.

The storage 150 may be connected to the controller 130 and may store a delay time that is usable at a sampling timing of a current, a preset value regarding the length of the effective vector length, and the like.

The display 160 may be connected to the controller 130, and may visually display information regarding the sampled current to a user under the control of the controller 130.

Figure 2:
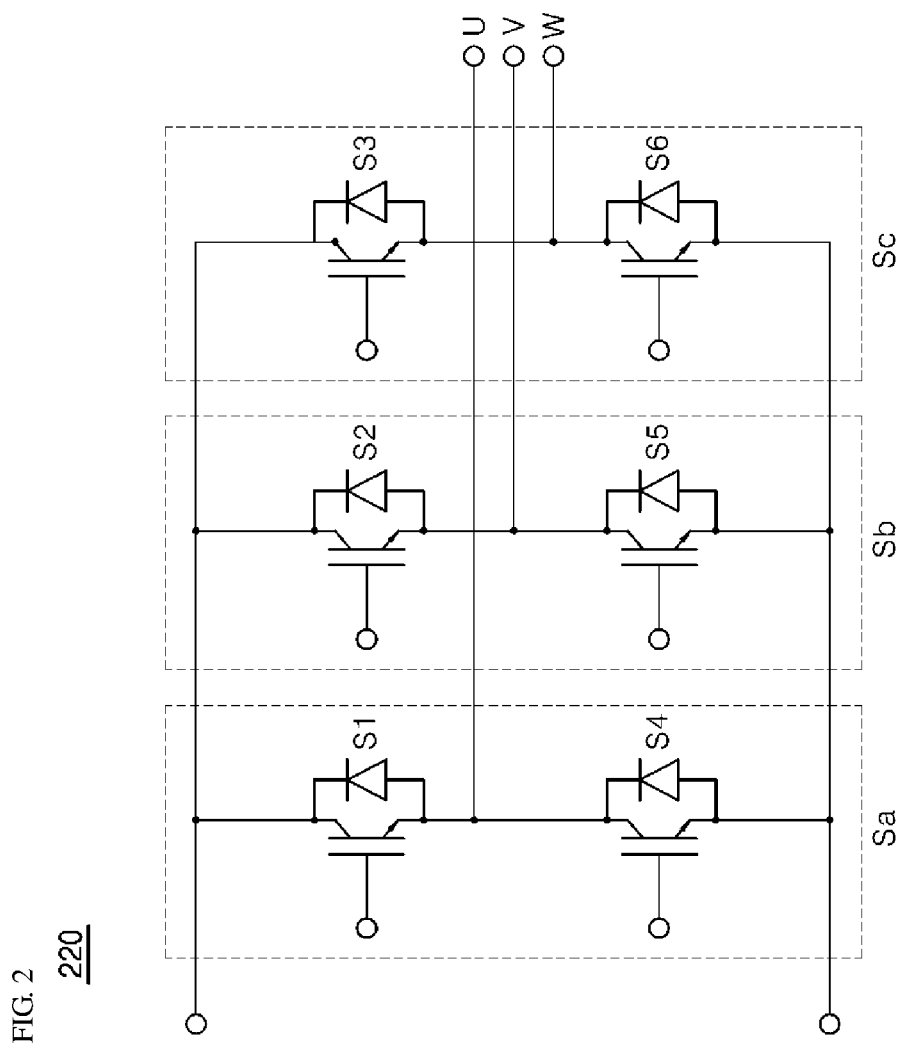
FIG. 2 is a diagram illustrating an arrangement of switching elements connected to an inverter part.

FIG. 2 is a diagram illustrating an arrangement of switching elements connected inside the inverter part 220.

Referring to FIG. 2, the switching elements connected inside the inverter part 220 may include upper-stage switching elements S1, S2, and S3 respectively disposed each between output lines for three phases (a U-phase, a V-phase, and a W-phase) and the high potential side DCP of the capacitor, and lower-stage switching elements S4, S5, and S6 respectively disposed each between the output lines for the three phases (the U-phase, the V-phase, and the W-phase) and the low potential side DCN of the capacitor.

In the present description, the switching elements disposed in the same row are connected to the output line for the same phase, and thus the upper-stage and lower-stage switching elements S1 and S4 for the U-phase will be denoted as Sa, the upper-stage and lower-stage switching elements S2 and S5 for the V-phase will be denoted Sb, and the upper-stage and lower-stage switching elements S3 and S6 for the W-phase will be denoted as Sc.

A vector regarding a switching voltage may be represented according to a state of each of Sa, Sb, and Sc. That is, when a case in which the upper-stage switching elements are turned on is denoted as 1, and a case in which the lower-stage switching elements are turned on is denoted as 0, the switching voltage may be represented as (100), (110), and the like. At this point, (100) refers that the upper-stage switching element of Sa, the lower-stage switching element of Sb, and the lower-stage switching element of Sc are turned on. That is, (100) refers that the switching elements S1, S5, and S6 are turned on.

Figure 3:
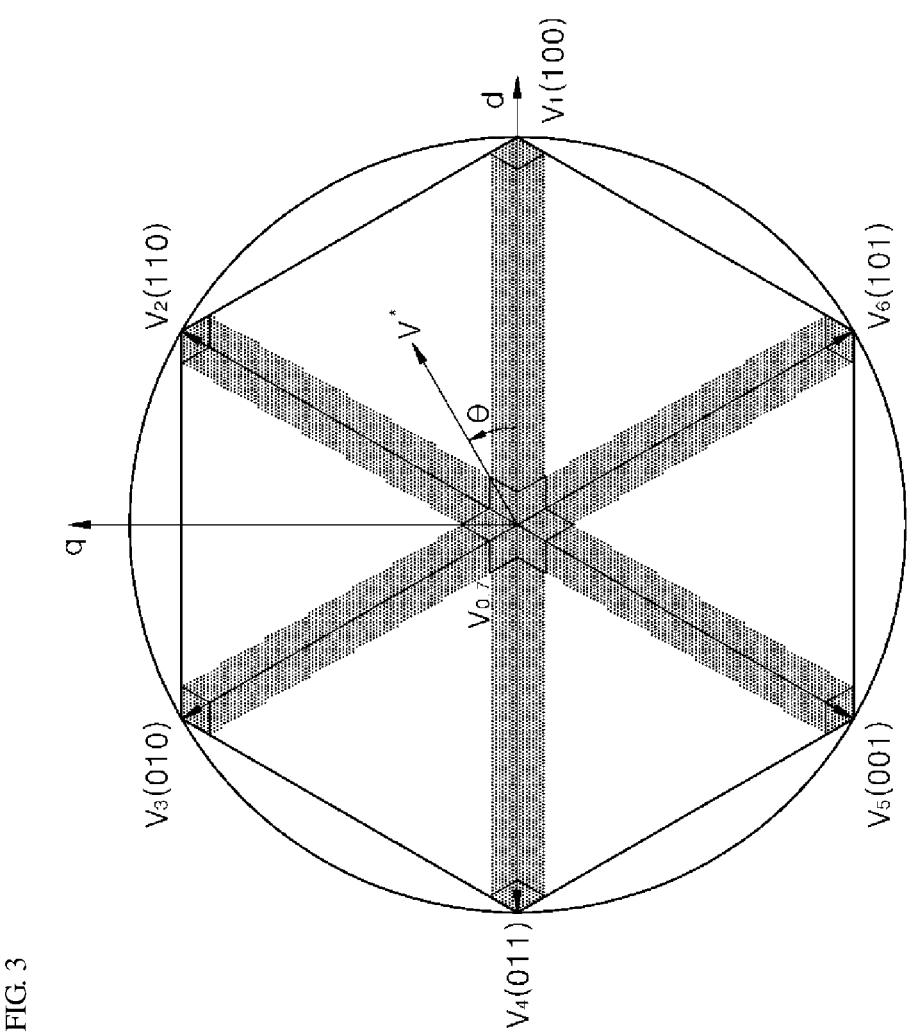
FIG. 3 is a diagram illustrating dq-axis converted voltages and vectors corresponding thereto.

FIG. 3 is a diagram illustrating dq-axis converted voltages and vectors corresponding thereto.

Referring to FIGS. 3, V0(000), V1(100), V2(110), V3(010), V4(011), V5(001), V6(101), and V7(111), which are dq-axis converted, are illustrated. V0(000) and V7(111) are not defined as effective vectors since a current does not flow in the power system 300 even though the switching elements are turned on by V0(000) and V7(111).

V1 to V6 may be defined as effective vectors, Sectors 1 to 6 may be respectively defined by between V1 and V2, between V2 and V3, between V3 and V4, between V4 and V5, between V5 and V6, and between V6 and V1, and an output current may be detected in sections except for shaded sections.

The following Table 1 represents an effective vector that is definable in each of Sectors 1 to 6, a detected current corresponding to the effective vector, and a relationship between the detected current and each of three-phase output currents Iu, Iv, and Iw.

TABLE 1

| Sector | Effective Vector | Detected Current | Iu | Iv | Iw |
|---|---|---|---|---|---|
| 1 | 100 | Iu = IDC | IDC | −(Iu + Iw) | −IDC |
|   | 110 | Iw = −IDC |   |   |   |
| 2 | 010 | Iu = IDC | −(Iv + Iw) | IDC | −IDC |
|   | 110 | Iw = −IDC |   |   |   |
| 3 | 010 | Iu = IDC | −IDC | IDC | −(Iu + Iv) |
|   | 011 | Iw = −IDC |   |   |   |
| 4 | 001 | Iu = IDC | −IDC | −(Iu + Iw) | IDC |
|   | 011 | Iw = −IDC |   |   |   |
| 5 | 001 | Iu = IDC | −(Iv + Iw) | −IDC | IDC |
|   | 101 | Iw = −IDC |   |   |   |
| 6 | 100 | Iu = IDC | IDC | −IDC | −(Iu + Iv) |
|   | 101 | Iw = −IDC |   |   |   |

For example, in Sector 1, when a current IDC flowing on the shunt resistor 110 with the effective vector (100) is measured, it can be seen that Iu=IDC, the current Iu flowing at the U-phase. Also, when the current IDC flowing on the shunt resistor 110 with the effective vector (110) is measured, a current Iw flowing at the W-phase may be obtained from Iw=−IDC. When the current Iu flowing at the U-phase and the current Iw flowing at the W-phase are obtained in Sector 1, a current flowing at the V-phase may be obtained from a relationship of Iu+Iv+Iw=0 by assuming that the three phases of the U-phase, the W-phase, and the V-phase are in equilibrium.

Figure 4:
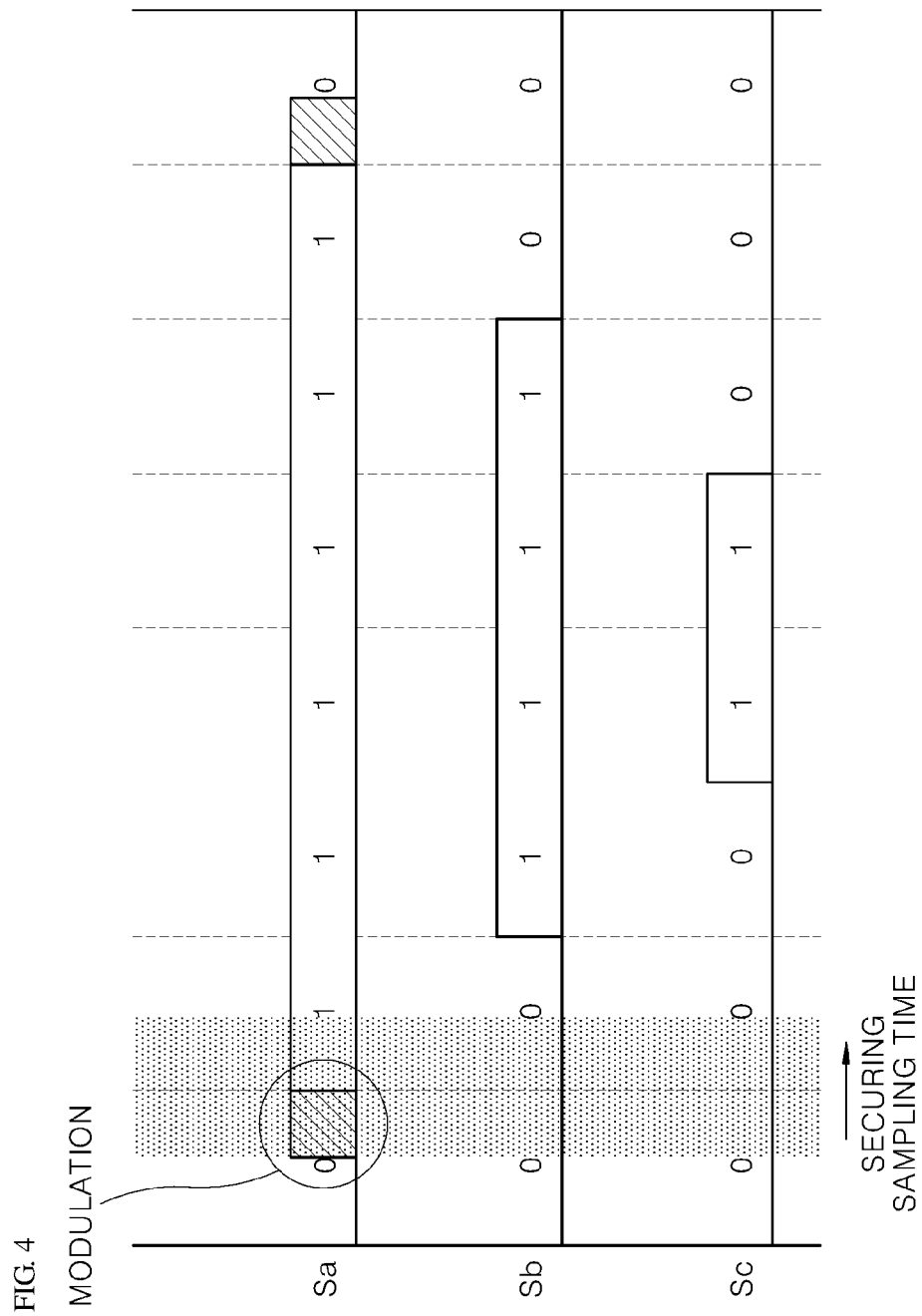
FIG. 4 is a diagram illustrating a pattern of a pulse width modulation (PWM) modulated switching voltage.

FIG. 4 is a diagram illustrating a pattern of a pulse width modulation (PWM) modulated switching voltage.

Referring to FIG. 4, when a length (a temporal length) of an effective vector is small and thus a sampling time of a current may not be secured, the controller 130 may perform a PWM modulation on the switching voltage to secure the length of the effective vector, which is greater than the sampling time.

Figure 5:
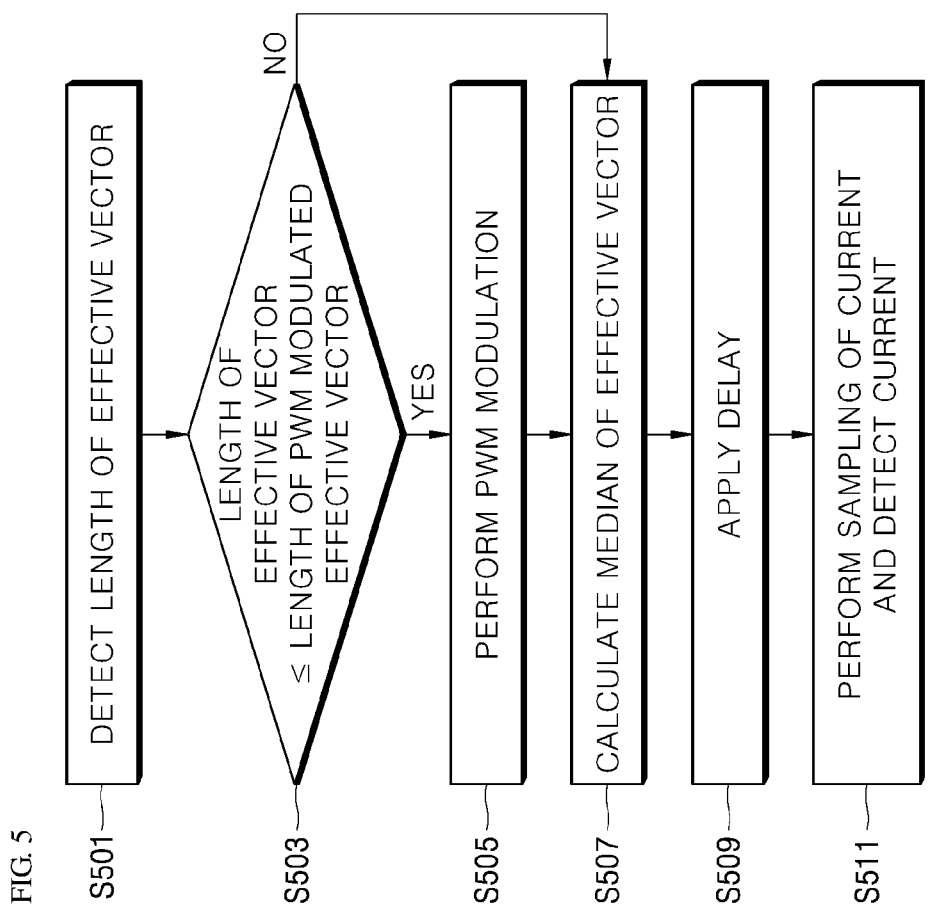
FIG. 5 is a flowchart illustrating a method for detecting an output current of an inverter according to one embodiment of the present disclosure.

FIG. 5 is a flowchart illustrating a method for detecting an output current of an inverter according to one embodiment of the present disclosure.

The method for detecting an output current of an inverter according to one embodiment of the present disclosure may be performed by the device for detecting an output current of an inverter according to one embodiment of the present disclosure. Therefore, the method for detecting an output current of an inverter according to one embodiment of the present disclosure will be mainly described with the detector 120 and the controller 130 of the device for detecting an output current of an inverter.

In operation S501, the controller 130 detects a length of an effective vector.

In operation S503, the controller 130 compares the length of the effective vector with that of a PWM modulated effective vector. When the length of the effective vector is less than or equal to that of the PWM modulated effective vector, the process proceeds to operation S505, and otherwise, the process proceeds to operation S507.

Here, the length of the PWM modulated effective vector may be set in consideration of a minimum time required for securing a sampling time. For example, the length of the PWM modulated effective vector may be set to be greater by 1 microseconds (µs) than the minimum time required for sampling of a current. However, the present disclosure is not limited to the described above.

Meanwhile, the minimum time required for securing the sampling time refers to a time including a dead time, a turn on time, and a voltage signal stabilization time when a switch is turned on or off.

In operation S505, the controller 130 may perform a PWM modulation to secure a sufficient length of the effective vector. Accordingly, the controller 130 may modulate the length of the effective vector with that of the PWM modulated effective vector. That is, the controller 130 modulates the length of the effective vector with a time that is greater than a time at which the current is stabilized.

In operation S507, the controller 130 may calculate a median of the length of the effective vector. The controller 130 may calculate the median of the length of the effective vector when the effective vector is not PWM modulated, while the controller 130 may calculate a median of the modulated effective vector when the effective vector is PWM modulated.

In operation S509, the controller 130 may determine a sampling timing by applying a delay time from the median of the effective vector. In this case, the controller 130 may determine the delay time to have a value that is slightly less than a half of the length of the PWM modulated effective vector.

For example, when the minimum time required for a sampling is 10 µs, the controller 130 may determine the length of the PWM modulated effective vector as 12 µs and the delay time as 5 µs. In this case, when the length of the effective vector is 10 µs, the effective vector is modulated with a length of 12 µs, and the sampling timing may be 11 µs to which the delay time of 5 µs is applied from 6 µs that is the median of the length of the PWM modulated effective vector. However, the present disclosure is not limited to the described above, and the delay time may be freely determined within a range that is less than the median.

In operation S511, the detector 120 may sample the current by corresponding to the determined sampling timing to provide the sampled current to the controller 130.

Figure 6:
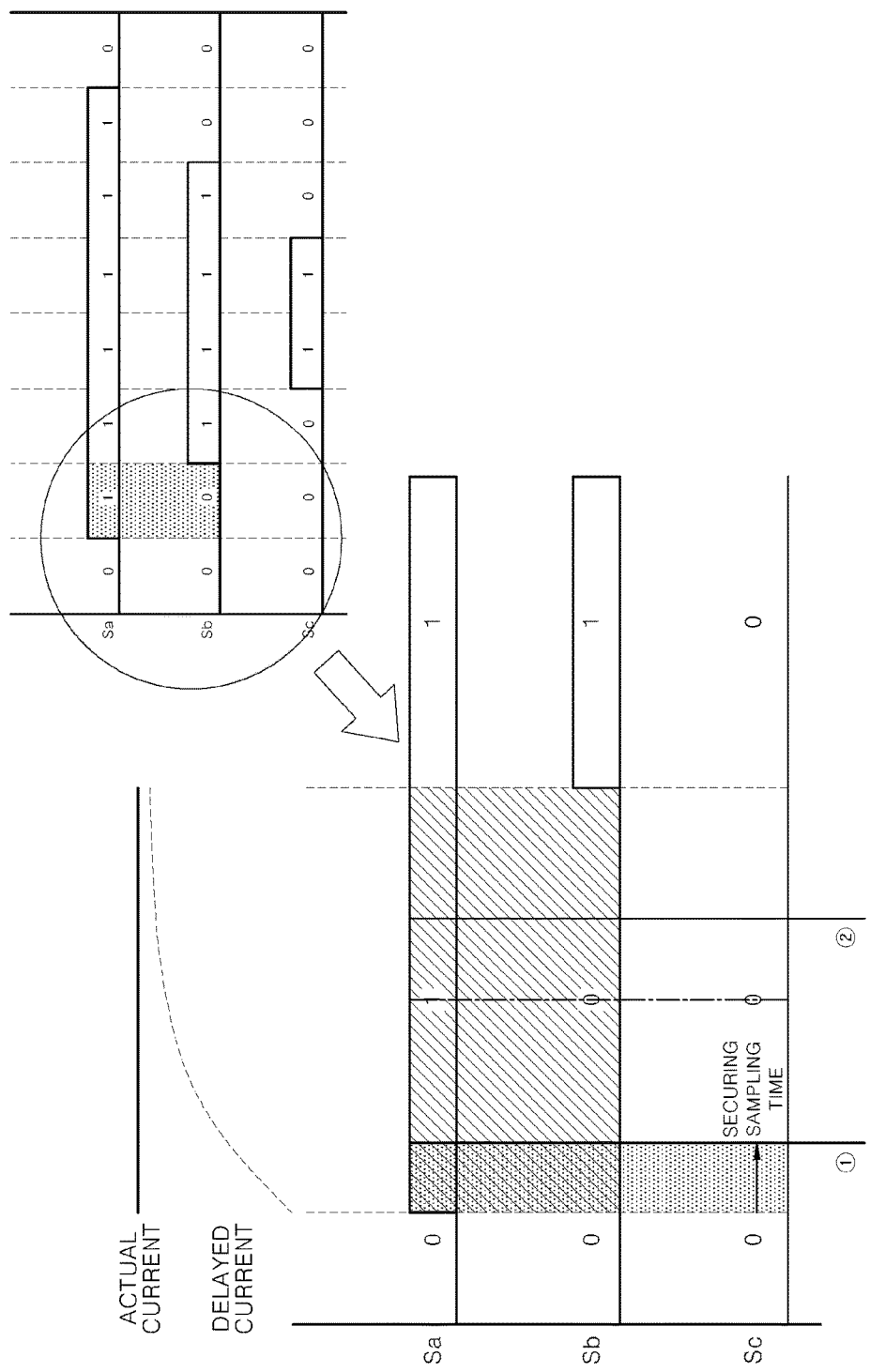
FIG. 6 is a diagram illustrating a sampling timing of a current when a length of an effective vector is sufficient.

FIG. 6 is a diagram illustrating a sampling timing of a current when a length of an effective vector is sufficient.

Referring to FIG. 6, there is exemplified a situation in which an error of the current may occur even though the sampling is performed after the minimum time required for a sampling (corresponding to a timing ①) from the starting point of the effective vector.

However, as in one embodiment of the present disclosure, since the controller 130 determines a timing after the delay time (corresponding to a timing ②) from the median (an alternate long and short dash line) of the length of the effective vector as the sampling timing, an error of a current being detected may be reduced.

Figure 7:
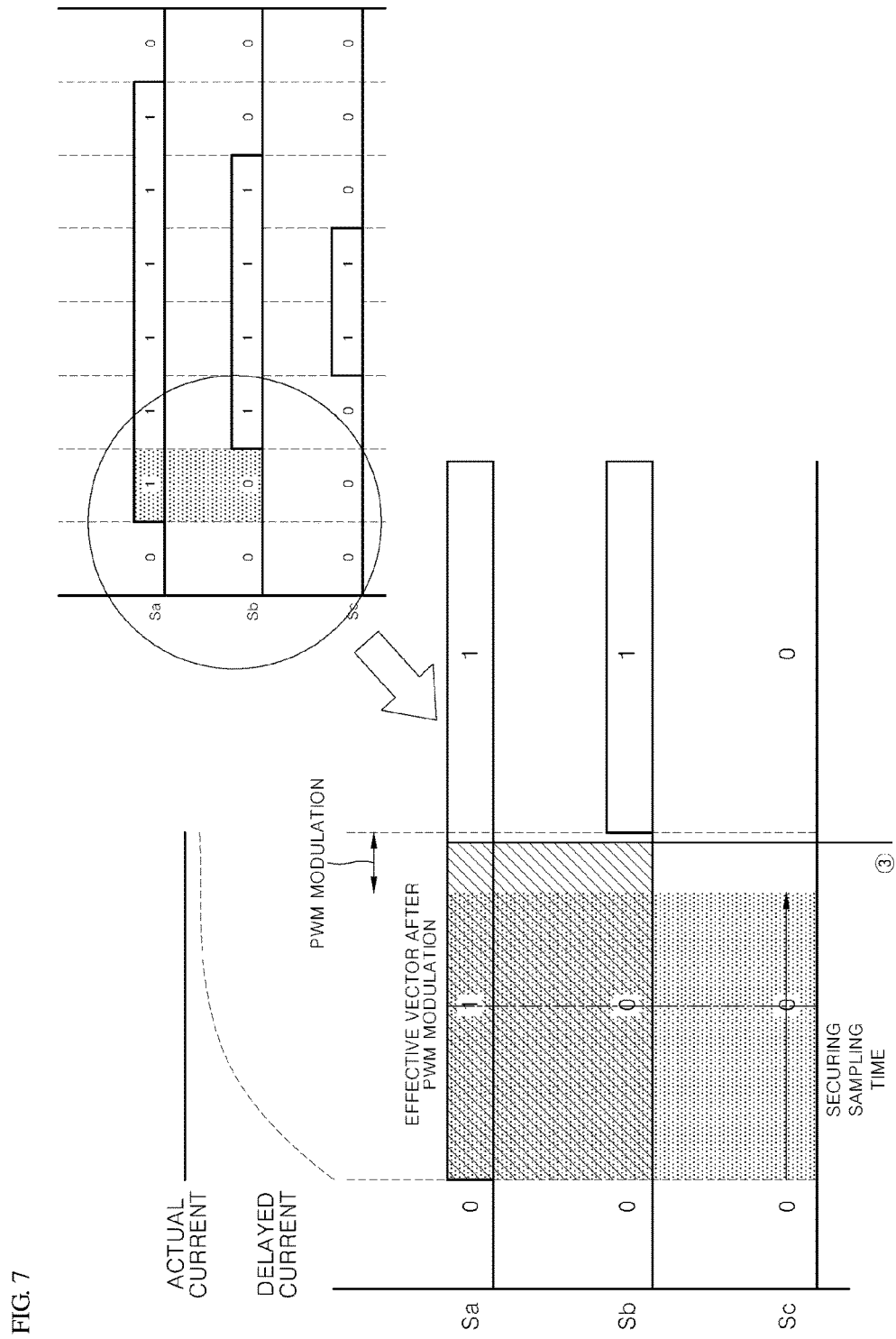
FIG. 7 is a diagram illustrating a PWM modulation and a sampling timing of a current when a length of an effective vector is insufficient.

FIG. 7 is a diagram illustrating a PWM modulation and a sampling timing of a current when a length of an effective vector is insufficient.

Referring to FIG. 7, it can be seen that the controller 130 modulates the effective vector with a length of a PWM modulated effective vector since a length of the effective vector is insufficient.

The controller 130 modulates the effective vector with the length of the PWM modulated effective vector as well as determines a timing after a delay time (corresponding to a timing ③) from a median of the modulated effective vector as a sampling timing such that the sampling may be prevented from being performed at another effective vector, and an error may be prevented from occurring in a current value.

Through the described above, the present disclosure may minimize possibility of a current detection error to accurately measure the output current provided to the inverter part.

The present disclosure described above may be variously substituted, altered, and modified by those skilled in the art to which the present disclosure pertains without departing from the scope and spirit of the present disclosure. Therefore, the present disclosure is not limited to the abovementioned exemplary embodiments and the accompanying drawings.

What is claimed is:

1. A device for detecting an output current of an inverter configured to control a power system, comprising:
   a shunt resistor connected to an output end of a capacitor of a direct current (DC) link;
   a detector connected to the shunt resistor and configured to detect the output current; and
   a controller configured to control a sampling timing of a current in the detector,
   wherein the controller compares a length of an effective vector regarding a switching voltage with a preset value and modulates the length of the effective vector,
   wherein the controller samples the current at a timing that is delayed by a set time based on a median of the length of the effective vector.

2. The device of claim 1, wherein the shunt resistor is connected to a low potential side.

3. The device of claim 1, wherein the controller modulates the length of the effective vector with a value that is greater than a time at which a current by the effective vector is stabilized.

4. The device of claim 1, wherein the controller determines the delayed timing as a value that is greater than a half of a time at which a current by the effective vector is stabilized.

* * * * *